United States Patent
Melton et al.

(10) Patent No.: US 6,436,730 B1
(45) Date of Patent: Aug. 20, 2002

(54) MICRELECTRONIC PACKAGE COMPRISING TIN COPPER SOLDER BUMP INTERCONNECTIONS AND METHOD FOR FORMING SAME

(75) Inventors: Cynthia Melton, Bolingbrook; Theresa L. Baker, Schaumburg, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/677,755

(22) Filed: Jul. 10, 1996

Related U.S. Application Data

(60) Continuation of application No. 08/342,491, filed on Nov. 21, 1994, now abandoned, which is a division of application No. 08/130,830, filed on Oct. 4, 1993, now Pat. No. 5,410,184.

(51) Int. Cl.⁷ .......................... H01L 21/48; H01L 23/48
(52) U.S. Cl. ........................ 438/108; 438/613; 257/738; 257/772; 257/778; 257/779; 257/780; 228/180.22
(58) Field of Search .................. 257/772, 779, 257/786, 737, 738, 780, 782, 783; 228/180.22; 437/183; 438/106, 108, 109, 118, 125, 613, 119

(56) References Cited

U.S. PATENT DOCUMENTS

| | | | |
|---|---|---|---|
| 2,671,844 A | * 3/1954 | Laubmeyer et al. | |
| 3,488,840 A | * 1/1970 | Hymes et al. | 437/183 |
| 4,661,192 A | * 4/1987 | McShane | 228/180.22 |
| 4,706,811 A | 11/1987 | Jung et al. | 206/331 |
| 4,758,407 A | 7/1988 | Ballentine et al. | 420/560 |
| 4,806,309 A | * 2/1989 | Tulman | 420/562 |
| 5,120,678 A | 6/1992 | Moore et al. | 437/183 |
| 5,154,341 A | * 10/1992 | Melton et al. | 228/180.2 |
| 5,269,453 A | * 12/1993 | Melton et al. | 228/180.22 |
| 5,282,565 A | * 2/1994 | Melton | 228/180.22 |
| 5,346,857 A | * 9/1994 | Scharr et al. | 437/183 |
| 5,352,407 A | * 10/1994 | Seelig et al. | 420/561 |
| 5,410,184 A | * 4/1995 | Melton et al. | 257/772 |
| 5,411,703 A | * 5/1995 | Gonya et al. | 420/561 |
| 5,527,628 A | * 6/1996 | Anderson et al. | 428/647 |

FOREIGN PATENT DOCUMENTS

| | | | | |
|---|---|---|---|---|
| EP | 0 061 593 A | * | 6/1982 | 257/772 |
| JP | 58-134449 | * | 8/1983 | 257/772 |
| JP | 4-225542 | * | 8/1992 | |
| JP | 4307944 | * | 10/1992 | 257/772 |
| JP | 5036754 | * | 2/1993 | 257/750 |

OTHER PUBLICATIONS

Kuhn, L. and R. Lane, High–Density, Low–Temperature Solder Reflow Bonding of Silicon Chips to Plastic Substrates, IBM Technical Disclosure Bulletin, vol. 18 No. 10, p. 3477, Mar. 1, 1976.*

Edwards, J.C., Photo–Defined Lamination for Chip Bonding, IBM Technical Disclosure Bulletin, vol. 25 No. 4, pp. 1952–3, Sep. 1, 1982.*

American society for Metals, "Soldering", *Welding Braizing and Soldering*; vol. 6, *Metals Handbook*, 9th Edition (1983), pp. 1069–1076.

* cited by examiner

Primary Examiner—David L. Talbott
Assistant Examiner—Alonzo Chambliss
(74) Attorney, Agent, or Firm—Kenneth A. Haas

(57) ABSTRACT

A microelectronic package (10) comprises an integrated circuit component (12) mounted on a substrate (14) by solder bump interconnections (16) formed of a lead-free, tin-base solder alloy that contains a significant copper addition. A preferred solder is composed of a tin alloy containing between about 2 and 8 weight percent copper, preferably between about 3 and 5 weight percent. In the absence of lead, it is found that precipitation of copper-containing intermetallics of the type that adversely affect tin-lead solders is reduced. Moreover, the lead-free copper-tin solder alloy exhibits a high surface tension to reduce collapse of component toward the substrate during solder reflow.

5 Claims, 1 Drawing Sheet

MICRELECTRONIC PACKAGE COMPRISING TIN COPPER SOLDER BUMP INTERCONNECTIONS AND METHOD FOR FORMING SAME

This is a continuation of application Ser. No. 08/342,491, filed Nov. 21, 1994 and now abandoned, which is a division of application Ser. No. 08/130,830, filed Oct. 4, 1993, U.S. Pat. No. 5,410,184

BACKGROUND OF THE INVENTION

This invention relates to a microelectronic package comprising an integrated circuit component mounted on a substrate by solder bump interconnections. More particularly, this invention relates to such microelectronic package wherein the solder bump interconnections are formed of a tin-base, lead-free solder alloy that includes a controlled copper addition.

In the manufacture of microelectronic packages, it is known to attach an integrated circuit component to a substrate, such as a printed circuit board or the like, by a plurality of solder bump interconnections. Each solder bump interconnection joins a first bond pad on the substrate to a second bond pad on the integrated circuit component. The integrated circuit component may be an integrated circuit die affixed to a ceramic or polymeric carrier that is in turn attached to the board. Alternately, the component may be an integrated circuit die that is inverted and attached directly to the board. In either event, the component comprises a surface facing the substrate whereon the second bond pads are disposed in a pattern superposable onto the first bond pads.

To form the interconnections, a solder bump is deposited onto each bond pad of the component. A common method comprises placing a preformed microsphere of solder onto each pad and heating to reflow the solder to form the bump. Alternately, solder may be deposited by electroplating or other suitable metal deposition process. The component with the solder bumps is assembled with the substrate so that each bump rests against a corresponding bond pad on the board. The assembly is heated to melt and reflow the solder. During reflow, the component is supported by the molten solder. This is accompanied by collapse of the component toward the board until the weight of the component is balanced by the surface tension of the molten solder. Concurrently, the molten solder wets the bond pads, which wetting is essential to forming a strong solder bond. Upon cooling, the solder resolidifies to complete the interconnections. The solder bump interconnections not only physically attach the component to the board, but also electrical connect the pads on the component to the pads on the substrate for conducting electrical signals to or from the component for processing.

Common solder is formed of tin-lead alloy. During reflow, copper from the bond pad tends to dissolve into the molten solder. Copper dissolution is limited by the solubility of copper at the reflow temperature and is typically less than 0.5 percent. Upon cooling, the dissolved copper forms intermetallic precipitates that tend to reduce the strength of the interconnections. For this reason, it has been desired to minimize copper content in tin-lead solder alloy.

SUMMARY OF THE INVENTION

This invention contemplates a microelectronic package comprising an integrated circuit component mounted on a printed circuit board or the like by a plurality of solder bump interconnections formed from a lead-free, tin-base solder alloy that contains a significant copper addition. In general, the solder alloy in accordance with this invention is composed between about 2 and 8 weight percent copper, preferably between about 3 and 5 weight percent. Optionally, the alloy may contain silver or other metallic additive to enhance mechanical properties. Lead is present only as impurity, preferably less than 0.1 weight percent.

In one aspect of this invention, a method is provided that includes initially forming solder bumps having the desired copper addition onto the bond pads of the integrated circuit component. The component is assembled with the substrate, and the assembly is heated and cooled to reflow the solder alloy and form the desired solder bump interconnections. It is found that the tin-copper solder alloy exhibits a high surface tension effective to reduce collapse of the component toward the substrate during reflow. It is also found that, in the absence of lead, precipitation of copper intermetallics is inhibited, so that the resulting solder bump interconnections exhibit mechanical strength comparable to prior tin-lead interconnections despite the significant copper addition.

BRIEF DESCRIPTION OF THE DRAWINGS

The present invention will be further illustrated with reference to the accompanying drawings wherein.

DETAILED DESCRIPTION OF THE INVENTION

Figure 2:
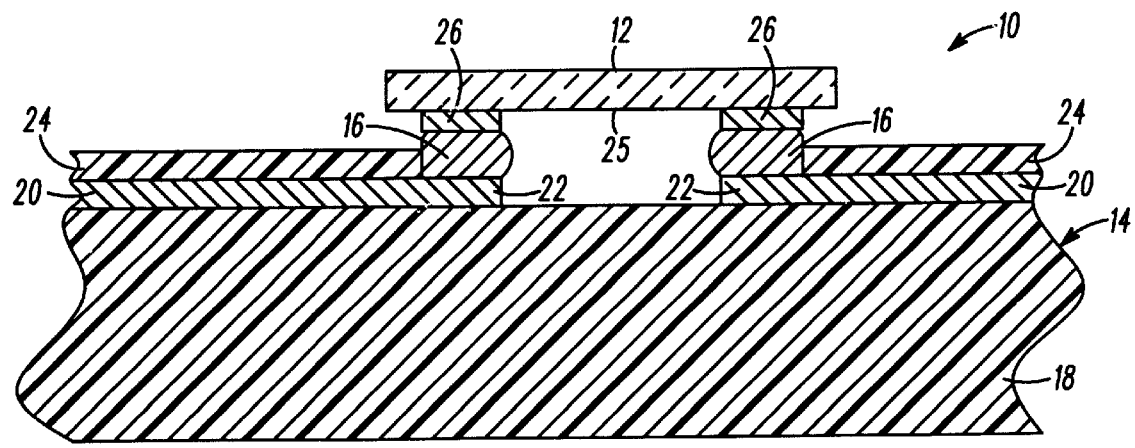
FIG. 2 is a cross-section view of a microelectronic package produced from the elements of FIG. 1.

In accordance with a preferred embodiment, this invention is employed to fabricate a microelectronic package 10 in FIG. 2 comprising an integrated circuit component 12 mounted onto a substrate 14 by a plurality of solder bump interconnections 16 formed of a lead-free, tin-base copper alloy.

Figure 1:
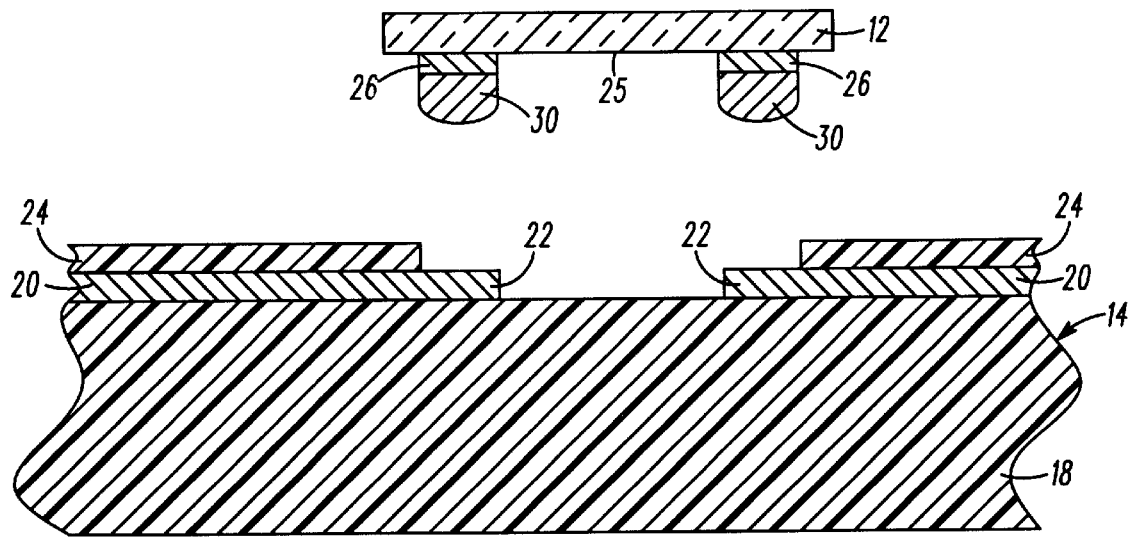
FIG. 1 is a cross-sectional view of an integrated circuit component and a printed circuit board in preparation for forming a microelectronic package in accordance with this invention.

Referring to FIG. 1, there is shown component 12 and substrate 14 prior to formation of microelectronic package 10, In this embodiment, substrate 14 is a printed circuit board of the type referred to as an FR4 card and comprising a base 18 composed of an epoxy resin and glass fiber laminate. A circuit trace 20 is disposed on base 18 and is formed of metallic copper. Trace 20 includes a plurality of copper bond pads 22, which constitute first bond pads for forming the interconnections. While only a few pads are depicted for purposes of illustration of this invention, it will be understood that such packages typically comprise up to several hundred pads arrange in a pattern, such as a regular array. A solder stop 24 is applied to the circuit trace adjacent the bond pad to confine the solder to the pad during ref low.

In this embodiment, component 12 is an integrated circuit die of the type formed by processing a semiconductor silicon wafer to form electrical features for processing an electrical signal. Die 12 includes a generally planar surface 25 that faces substrate 14 and includes a plurality of bond pads 26. Bond pads 26 substitute second bond pads for forming the interconnection and are disposed in a pattern superposable onto the pattern of first bond pads 22. Pads 26 are formed of aluminum coated with sequential layers of chromium, copper and gold to promote wetting by molten solder alloy.

In preparation for mounting component 12 onto board 14, a plurality of solder bumps 30 are formed on aluminum pads 26 as shown in FIG. 1. With component surface 24 facing up, a microsphere of solder alloy is placed onto each bond pad 26. In accordance with this embodiment, the preformed microsphere is composed of about 4.0 weight percent copper, about 0.5 weight percent silver and the balance tin and contains less than 0.1 weight percent lead as impurity. Following the placement of microspheres, component 12 is heated to a temperature above 225° C. for approximately three minutes in a nitrogen or other nonoxidizing atmosphere. During this time, the solder melts and wets the underlying pad. Upon cooling, the solder resolidifies to form solder bumps 30 bonded to bond pads 26.

Component 12 with the solder bumps 30 is then superposed onto substrate 14 so that each bump 30 rests against a corresponding bond pad 22 of substrate 14. A rosin-base flux may be applied to the solder bumps prior to arranging component 12 and substrate 14. The assembly is then heated to a temperature of 225° C. for approximately 1 minute. During this time, the solder alloy melts and wets the adjacent bond pads 22. The assembly is then cooled to resolidify the solder and form solder bump interconnections 16.

The resulting microelectronic package 10 thus comprises component 12 attached to substrate 14 by solder bump interconnections 16. Each solder bump interconnection 16 is solder bonded to a first bond pad 22 of substrate 14 and a second bond pad 26 of component 12 and extends continuously therebetween. Solder bump interconnection 16 not only physically attach component 12 to substrate 14 but also electrically connect pads 26 to the corresponding pads 22 for conducting electrical signals to or from component 12 for processing.

While not limited to any particular theory, it is found that solder bump interconnections formed from lead-free tin-base solder alloy in accordance with this invention do not exhibit intermetallic precipitates of the type that have a deleterious effect upon the mechanical properties of tin-lead solder This is in part attributed to the absence of lead, which, although not contained within the intermetallic compounds, is nevertheless believed to play an instrumental role in their precipitation. The inhibition of intermetallic precipitation is even more remarkable in view of the relatively high copper addition, about 4 percent in the described embodiment, substantially higher than the copper concentration typically found in tin-lead solder. Moreover, the tin-copper solder in accordance with this invention is believed to reduce collapse of the component toward the substrate during reflow and thereby maximize the stand-off between the component and the substrate. This is attributed to the relatively high surface tension exhibited by the tin-copper alloy. Still further, in the described embodiment, solder bump interconnections are formed onto copper pads. The addition of copper to the solder alloy retards dissolution of copper from the pads, thereby preventing erosion of pads and further increasing the stand-off.

Solder alloys in accordance with this invention are predominantly tin, substantially free of lead, and contain a significant addition of copper. In general, suitable solders are composed of at least about 90 weight percent tin and contain less than 0.1 percent lead. Tin alloys containing more than 8 weight percent copper exhibit a high melting point that tends to damage common materials utilized for components and substrates. It is desired to formulate the alloy to include at least 2 weight percent copper to approach saturation at common reflow temperatures up to about 240° C. and thereby inhibit dissolution of copper from the bond pads. Moreover, a copper content greater than about 3 weight percent is desired to reduce the reflow temperature below about 225° C. A preferred copper range is between about 3 and 5 weight percent. Optionally, the solder alloy may contain a minor addition of an agent, such as silver in the described embodiment, to further enhance strength and solderability. When present, silver is preferred in concentrations up to 1.5 weight percent and more preferably between 0.75 and 1.25 weight percent.

In the described embodiment, this invention was utilized to form a microelectronic package that included an integrated circuit die directly mounted onto a printed circuit board. Alternately, the method of this invention may be utilized to attach a component that comprises an integrated circuit die mounted on a carrier and in which the bond pads for the solder bump interconnections are disposed on the surface of the carrier. Also, while in the described embodiment the solder bumps were formed by reflowing performed microspheres of the desired tin-base solder alloy containing copper, the solder alloy may be deposited onto the bond pads by any suitable process. In an alternate embodiment, solder may be deposited in the form of a solder paste in which metal particles are disposed in a vaporizable vehicle containing a binder. The powder may be formed of the desired solder alloy or may comprise a mixture of powders that are fusible to form the desired alloy. In still other embodiments, the tin-copper alloy may be sputtered, vapor deposited or electroplated onto the bond pads. For example, layers of tin and copper may be deposited individually onto the bond pads, optimally with silver layer; and the deposit heated to fuse the metals to form the desired solder alloy.

While this invention has been described in terms of certain embodiments, it is not intended to be limited to the above description, but rather only to the extent set forth in the claim that follow The embodiments of the invention in which an exclusive property or privilege is claimed are defined as follows:

What is claimed is:

1. A method for attaching an integrated circuit component to a substrate by solder bump interconnections, said substrate comprising a plurality of first bond pads, said integrated circuit component comprising a plurality of second bond pads formed of solder-wettable metal, said method comprising forming a solder bump onto each second bond pad, said solder bump being formed of a lead-free solder alloy composed predominantly of tin and optionally up to 1.5 weight percent silver and containing between 2 and 8 weight percent copper, superposing the integrated circuit component onto the substrate to form an assembly such that each solder bump rests against a corresponding first bond pad, heating the assembly for a time and at a temperature effective to melt said lead-free solder alloy, whereupon each solder bump forms molten solder that wets the corresponding first bond pad, and cooling to solidify the solder to form solder bump interconnections bonding the first bond pads and the second bond pads.

2. A method in accordance with claim 1 wherein the assembly is heated at a temperature above 225° C.

3. A method for attaching an integrated circuit component to a printed circuit board by a plurality of solder bump interconnections, said printed circuit board having a generally planar surface comprising a plurality of first bond pads formed of metallic copper, said integrated circuit component comprising a generally planar surface comprising a plurality of second bond pads formed of solder-wettable metal, said method comprising forming onto each second bond pad a solder bump formed of a solder alloy consisting essentially of between 2 and 8 weight percent copper, optionally up to 1.5 weight percent silver, less than 0.1 weight percent lead, and the balance substantially tin, superposing the integrated circuit component onto the printed circuit board such that each solder bump rests against a corresponding first bond pad, thereby forming an assembly, heating the assembly for a time and at a temperature, less than 240° C. effective to reflow said solder bumps, whereupon each solder bump forms molten solder that wets the corresponding first bond pad, and cooling to solidify the solder to form a solder bump interconnection bonding the first bond pads and the second bond pads.

4. A method in accordance with claim 3 wherein the assembly is heated at a temperature above 225° C.

5. A method in accordance with claim 3 wherein the solder bumps are formed by placing a preformed microsphere of the solder alloy onto each second bond pad, heating at a temperature and for a time effective to melt the solder alloy, whereupon each microsphere forms molten solder alloy that wets the adjacent second bond pad, and cooling to solidify the molten solder alloy to form the solder bumps bonded to the second bond pads.

* * * * *

UNITED STATES PATENT AND TRADEMARK OFFICE
CERTIFICATE OF CORRECTION

PATENT NO. : 6,436,730 B1
DATED : August 20, 2002
INVENTOR(S) : Cynthia Melton et al.

It is certified that error appears in the above-identified patent and that said Letters Patent is hereby corrected as shown below:

<u>Title page,</u>
Item [*] Notice, delete "0" and insert -- 1444 --.

Signed and Sealed this

Fourth Day of May, 2004

JON W. DUDAS
*Acting Director of the United States Patent and Trademark Office*